United States Patent
Daitoku et al.

(12)

(10) Patent No.: US 11,410,855 B2
(45) Date of Patent: Aug. 9, 2022

(54) METHOD OF PRODUCING ELECTROCONDUCTIVE SUBSTRATE, ELECTRONIC DEVICE AND DISPLAY DEVICE

(71) Applicant: TDK CORPORATION, Tokyo (JP)

(72) Inventors: Takashi Daitoku, Tokyo (JP); Susumu Taniguchi, Tokyo (JP); Akiko Seki, Tokyo (JP); Atsushi Sato, Tokyo (JP); Yuhei Horikawa, Tokyo (JP); Makoto Orikasa, Tokyo (JP); Hisayuki Abe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 188 days.

(21) Appl. No.: 16/997,092

(22) Filed: Aug. 19, 2020

(65) Prior Publication Data

US 2020/0381266 A1 Dec. 3, 2020

Related U.S. Application Data

(62) Division of application No. 16/038,711, filed on Jul. 18, 2018, now Pat. No. 10,784,122.

(30) Foreign Application Priority Data

Jul. 28, 2017 (JP) .............................. JP2017-146671

(51) Int. Cl.
*H01L 21/48* (2006.01)
*G03F 7/00* (2006.01)
(Continued)

(52) U.S. Cl.
CPC ...... *H01L 21/4853* (2013.01); *C23C 18/1605* (2013.01); *C23C 18/1882* (2013.01);
(Continued)

(58) Field of Classification Search
CPC ...................................................... G03F 7/0002
See application file for complete search history.

(56) References Cited

U.S. PATENT DOCUMENTS 7,100,263 B2    9/2006   Imada et al.
7,928,004 B2    4/2011   Seidel et al.
(Continued)

FOREIGN PATENT DOCUMENTS

JP    2016-164694 A    9/2016
JP    2016-526278 A    9/2016
(Continued)

OTHER PUBLICATIONS

Feb. 24, 2020 Office Action Issued in U.S. Appl. No. 16/038,711.

*Primary Examiner* — Daniel Luke
(74) *Attorney, Agent, or Firm* — Oliff PLC

(57) ABSTRACT

A method of producing an electroconductive substrate including a base material, and an electroconductive pattern disposed on one main surface side of the base material includes: a step of forming a trench including a bottom surface to which a foundation layer is exposed, and a lateral surface which includes a surface of a trench formation layer, according to an imprint method; and a step of forming an electroconductive pattern layer by growing metal plating from the foundation layer which is exposed to the bottom surface of the trench.

13 Claims, 9 Drawing Sheets

(51) Int. Cl.
    *H01L 33/62* (2010.01)
    *C23C 18/18* (2006.01)
    *C23C 18/20* (2006.01)
    *C23C 18/16* (2006.01)
    *C23C 18/30* (2006.01)
    *C23C 18/31* (2006.01)
    *H01L 23/00* (2006.01)
    *C23C 18/38* (2006.01)
    *H01L 25/075* (2006.01)

(52) U.S. Cl.
    CPC ...... *C23C 18/1889* (2013.01); *C23C 18/1893* (2013.01); *C23C 18/206* (2013.01); *C23C 18/208* (2013.01); *C23C 18/2066* (2013.01); *C23C 18/2086* (2013.01); *C23C 18/30* (2013.01); *C23C 18/31* (2013.01); *G03F 7/0002* (2013.01); *H01L 21/4857* (2013.01); *H01L 33/62* (2013.01); *C23C 18/1608* (2013.01); *C23C 18/1651* (2013.01); *C23C 18/1879* (2013.01); *C23C 18/38* (2013.01); *H01L 24/13* (2013.01); *H01L 24/16* (2013.01); *H01L 24/81* (2013.01); *H01L 25/0753* (2013.01); *H01L 2224/0401* (2013.01); *H01L 2224/11464* (2013.01); *H01L 2224/13109* (2013.01); *H01L 2224/13111* (2013.01); *H01L 2224/13113* (2013.01); *H01L 2224/13139* (2013.01); *H01L 2224/13147* (2013.01); *H01L 2224/16227* (2013.01); *H01L 2224/16238* (2013.01); *H01L 2224/81191* (2013.01); *H01L 2224/81192* (2013.01); *H01L 2224/81801* (2013.01); *H01L 2924/12041* (2013.01); *H01L 2933/0066* (2013.01); *Y10S 977/887* (2013.01)

(56) References Cited

U.S. PATENT DOCUMENTS

| | | |
|---|---|---|
| 2008/0264672 A1 | 10/2008 | Markley et al. |
| 2008/0317402 A1 | 12/2008 | Kodama et al. |
| 2012/0327021 A1 | 12/2012 | Ryu et al. |
| 2015/0000962 A1 | 1/2015 | Gao et al. |
| 2015/0021069 A1 | 1/2015 | Chiu et al. |
| 2016/0255721 A1 | 9/2016 | Chiu et al. |
| 2016/0342242 A1 | 11/2016 | Hata et al. |

FOREIGN PATENT DOCUMENTS

| | | | |
|---|---|---|---|
| JP | 2018-085358 | * | 5/2018 |
| KR | 1999-0079997 A | | 11/1999 |
| KR | 2010-0079984 A | | 7/2010 |
| KR | 10-2014-0023512 A | | 2/2014 |
| TW | 201203064 A | | 1/2012 |
| TW | 201437895 A | | 10/2014 |
| TW | 201505493 A | | 2/2015 |
| WO | 2007/074567 A1 | | 7/2007 |
| WO | 2014/153895 A1 | | 10/2014 |

* cited by examiner

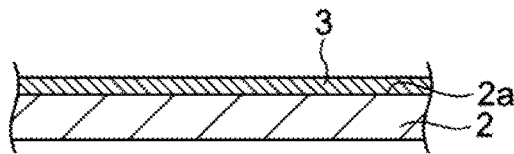
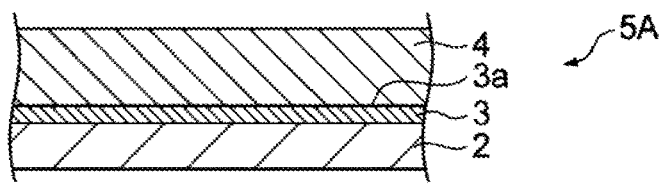
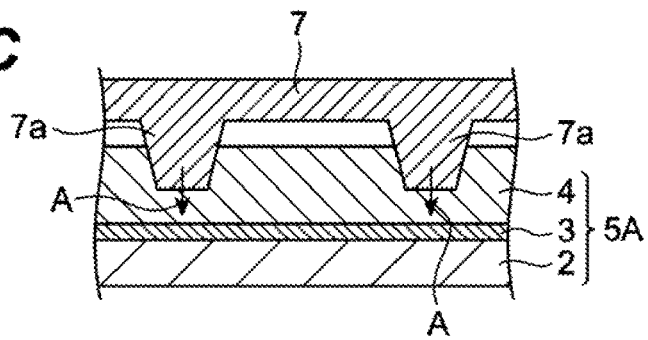
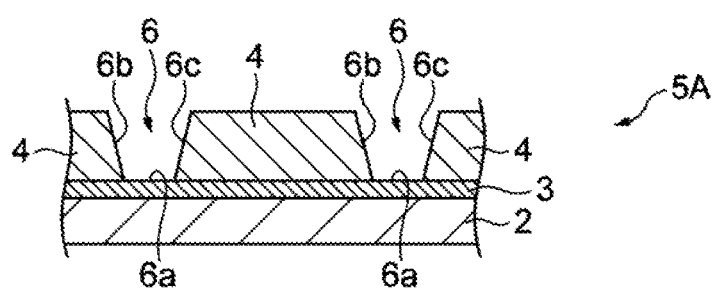
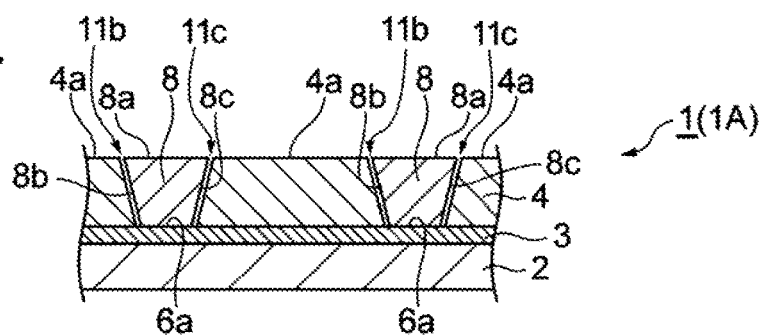
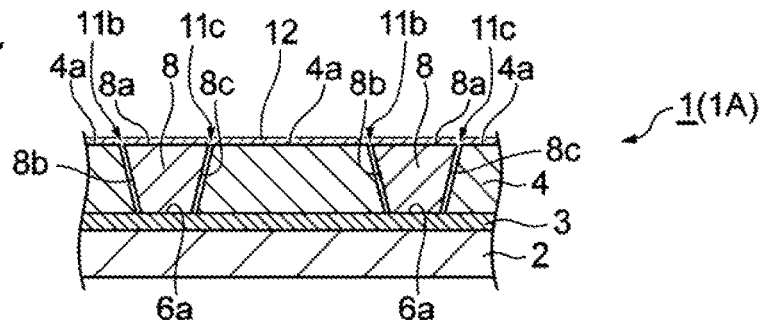

METHOD OF PRODUCING ELECTROCONDUCTIVE SUBSTRATE, ELECTRONIC DEVICE AND DISPLAY DEVICE

This is a Divisional of application Ser. No. 16/038,711 filed Jul. 18, 2018, which claims the benefit of Japanese Patent Applications No. 2017-146671 filed Jul. 28, 2017. The disclosure of the prior applications is hereby incorporated by reference herein in its entirety.

TECHNICAL FIELD

The present invention relates to a method of producing an electroconductive substrate, an electronic device, and a display device.

BACKGROUND

There is a case where a transparent antenna provided with an electroconductive substrate having transparency and electroconductivity, is mounted on a surface of a touch panel or a display. Currently, the electroconductive substrate has been required to have high transparency and electroconductivity, and high flexibility, according to an increase in the size and diversification of the touch panel and the display. An electroconductive substrate of the related art, for example, includes an electroconductive pattern layer which is formed of a resin containing ITO, a metal foil, or an electroconductive nanowire, and forms a fine pattern, on a transparent base material.

However, ITO or the electroconductive nanowire is an expensive material. In addition, etching is general as a method of forming a fine electroconductive pattern layer on a base material, but in the method using etching, steps such as an exposing step, a developing step, an etching step, and a peeling step, are necessary, and the number of steps increases. For such a reason, there is a limit to produce an electroconductive substrate at low cost.

In Japanese Unexamined Patent Publication No. 2016-164694, a method is disclosed in which a trench is formed on a transparent base material formed of a resin, the entire surface of the transparent base material is filled with an electroconductive material such as copper according to a vapor deposition method or a sputtering method, the electroconductive material except for that in the trench is removed by etching, and thus, an electroconductive layer is formed, as a method of producing the electroconductive substrate at low cost. On the other hand, in International Publication No. 2014/153895, a method is disclosed in which a trench is formed on a transparent base material formed of a resin, and the trench is filled with an electroconductive material.

SUMMARY

However, in the electroconductive substrate of the related art, including the electroconductive pattern layer filling the trench, the electroconductive layer is peeled off, or electroconductivity decreases, at the time of repeatedly bending the electroconductive substrate.

An object of the present invention is to provide a method capable of producing an electroconductive substrate, in which an electroconductive pattern layer filling a trench is provided, and the peeling of the electroconductive pattern layer and a decrease in electroconductivity due to bending are suppressed, and a method of producing an electronic device and a display device, using the electroconductive substrate.

According to one aspect of the present invention, a method of producing an electroconductive substrate including a base material, and an electroconductive pattern layer disposed on one main surface side of the base material, is provided.

A method of producing an electroconductive substrate according to a first aspect, includes: a step of forming a trench including a bottom surface to which a foundation layer is exposed, and a lateral surface which includes a surface of a trench formation layer according to an imprint method including pushing a mold including a convex portion into the trench formation layer formed on the foundation layer which is formed on the base material, the foundation layer containing a catalyst; and a step of forming the electroconductive pattern layer which includes metal plating and fills the trench, by growing the metal plating from the foundation layer which is exposed to the bottom surface of the trench.

A method of producing an electroconductive substrate according to a second aspect, includes: a step of forming a trench including a bottom surface to which a foundation layer is exposed, and a lateral surface which includes a surface of a trench formation layer according to an imprint method including pushing a mold including a convex portion into the trench formation layer formed on the foundation layer which is formed on the base material; a step of adsorbing a catalyst in the foundation layer which is exposed to the bottom surface of the trench; and a step of forming the electroconductive pattern layer which includes metal plating and fills the trench, by growing the metal plating from the foundation layer in which the catalyst is adsorbed.

In the first aspect and the second aspect, it is preferable that the metal plating is grown such that a gap is formed between at least a part of a lateral surface of the electroconductive pattern layer and the lateral surface of the trench.

The method according to the first aspect and the second aspect, may further include: a step of blackening at least a part of a surface of the electroconductive pattern layer, including a surface on a side opposite to the bottom surface of the trench.

The method according to the first aspect and the second aspect, may further include: a step of forming a protective film covering at least a part of a surface of the trench formation layer and the electroconductive pattern layer on a side opposite to the base material.

The electroconductive pattern layer may include a mesh-like pattern.

According to another aspect of the present invention, a method of producing an electronic device including an electroconductive substrate which includes a base material, and an electroconductive pattern layer disposed on one main surface side of the base material, and an electronic component, is provided.

According to still another aspect of the present invention, a method of producing a display device including an electroconductive substrate which includes a base material, and an electroconductive pattern layer disposed on one main surface side of the base material, and a light emitting element, is provided.

The method of producing the electronic device according to another aspect and the method of producing the display device according to still another aspect, include: a step of mounting the light emitting element on the electroconductive substrate which is obtained according to the method described above.

BRIEF DESCRIPTION OF THE DRAWINGS

FIGS. 1A to 1F are sectional views schematically illustrating a method of producing an electroconductive substrate according to a first embodiment.

DETAILED DESCRIPTION

Figure 2A:
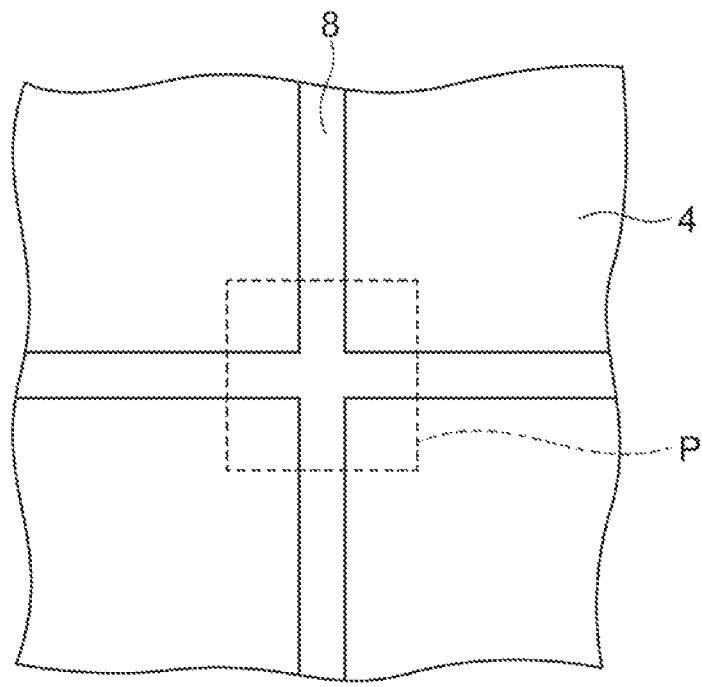
FIG. 2A is a partially enlarged view illustrating an electroconductive substrate according to one embodiment.

Hereinafter, embodiments of the present invention will be described with suitable reference to the drawings. Here, the present invention is not limited to the following embodiments.

First Embodiment

FIGS. 1A to 1E are sectional views schematically illustrating a method of producing an electroconductive substrate 1A according to a first embodiment. In the method according to this embodiment, first, as illustrated in FIG. 1A, a foundation layer 3 containing a catalyst is formed on one main surface 2a of a film-like base material 2. A step of FIG. 1A may be a step of preparing a laminated body including the base material 2, and the foundation layer 3 disposed on the base material 2.

It is preferable that the base material 2 is a transparent base material, in particular, is a transparent resin film. The transparent resin film, for example, may be a film of polyethylene terephthalate (PET), polycarbonate (PC), polyethylene naphthalate (PEN), a cycloolefin polymer (COP), or a polyimide (PI). Alternatively, the base material 2 may be a glass substrate, an Si wafer, or the like.

The thickness of the base material 2 may be greater than or equal to 10 µm, may be greater than or equal to 20 µm, or may be greater than or equal to 35 µm, and may be less than or equal to 500 µm, may be less than or equal to 200 µm, or may be less than or equal to 100 µm.

The foundation layer 3 contains a catalyst and a resin. The resin may be a curable resin, and examples thereof include an amino resin, a cyanate resin, an isocyanate resin, a polyimide resin, an epoxy resin, an oxetane resin, polyester, an allyl resin, a phenolic resin, a benzooxazine resin, a xylene resin, a ketone resin, a furan resin, a COPNA resin, a silicon resin, a dicyclopentadiene resin, a benzocyclobutene resin, an episulfide resin, an ene-thiol resin, a polyazomethine resin, a polyvinyl benzyl ether compound, acenaphthylene, and a ultraviolet ray curable resin having an unsaturated double bond, or a functional group causing a polymerization reaction by an ultraviolet ray, such as cyclic ether and vinyl ether, and the like.

It is preferable that the catalyst contained in the foundation layer 3 is an electroless plating catalyst. The electroless plating catalyst may be a metal selected from Pd, Cu, Ni, Co, Au, Ag, Pd, Rh, Pt, In, and Sn, and Pd is preferable. Only one type of the metal may be independently used, or a combination of two or more types thereof may be used, as the catalyst. In general, the catalyst is dispersed in the resin, as catalyst particles.

The content of the catalyst in the foundation layer 3, may be greater than or equal to 3 mass %, may be greater than or equal to 4 mass %, or may be greater than or equal to 5 mass %, and may be less than or equal to 50 mass %, may be less than or equal to 40 mass %, or may be less than or equal to 25 mass %, on the basis of the total amount of the foundation layer.

The thickness of the foundation layer 3, may be greater than or equal to 10 nm, may be greater than or equal to 20 nm, or may be greater than or equal to 30 nm, and may be less than or equal to 500 nm, may be less than or equal to 300 nm, or may be less than or equal to 150 nm.

A method of forming the foundation layer 3 on the base material 2 is not particularly limited, and for example, may be a method in which a curable resin composition for forming the foundation layer, containing a catalyst, a resin, and a solvent as necessary, is applied onto the main surface 2a of the base material 2, and the coated film is dried and/or cured. The coating, for example, is performed by using a bar coater.

Subsequently, as illustrated in FIG. 1B, a trench formation layer 4 is formed on a surface 3a of the foundation layer 3 on a side opposite to the base material 2. A step of FIG. 1B, may be a step of preparing a laminated body 5A including the base material 2, the foundation layer 3, and the trench formation layer 4 in this order.

It is preferable that the trench formation layer 4 is a transparent resin layer. In addition, the trench formation layer 4 may be a layer containing an uncured photocurable or thermosetting resin. Examples of the photocurable resin and the thermosetting resin configuring the trench formation layer 4, include an acrylic resin, an amino resin, a cyanate resin, an isocyanate resin, a polyimide resin, an epoxy resin, an oxetane resin, polyester, an allyl resin, a phenolic resin, a benzooxazine resin, a xylene resin, a ketone resin, a furan resin, a COPNA resin, a silicon resin, a dicyclopentadiene resin, a benzocyclobutene resin, an episulfide resin, an ene-thiol resin, a polyazomethine resin, a polyvinyl benzyl ether compound, acenaphthylene, and an ultraviolet ray curable resin having an unsaturated double bond, or a functional group causing a polymerization reaction by an ultraviolet ray, such as cyclic ether and vinyl ether, and the like.

It is preferable that a refractive index (nd25) of the trench formation layer 4 is less than a refractive index of the foundation layer 3, from the viewpoint of increasing the transparency of the electroconductive substrate, and for example, may be greater than or equal to 1.0, and may be less than or equal to 1.7, may be less than or equal to 1.6, or may be less than or equal to 1.5. The refractive index can be measured by a reflecting spectrographic film thickness meter.

Subsequently, as illustrated in FIG. 1C and FIG. 1D, a trench (a groove portion) 6 is formed according to an imprint method using a mold 7 including a convex portion 7a. In this step, the mold 7 including the convex portion 7a having a predetermined shape, is moved in a direction illustrated by an arrow A, and thus, is pushed into the trench formation layer 4 (FIG. 1C). The mold 7 may be pushed until a tip end of the convex portion 7a reaches the foundation layer 3. In this state, in a case where the trench formation layer 4 is the layer containing the uncured photocurable or thermosetting resin, the trench formation layer 4 is cured. In a case where the trench formation layer 4 is a layer containing the photocurable resin, the trench formation layer 4 is cured by being irradiated with light such as an ultraviolet ray. After that, the mold 7 is detached, and thus, the trench 6 having a shape on which the shape of the convex portion 7a of the mold 7 is reflected, is formed (FIG. 1D).

As illustrated in FIG. 1D, the trench 6 is formed of a bottom surface 6a to which the foundation layer 3 is exposed, and facing lateral surfaces 6b and 6c including a surface of the trench formation layer 4 surrounding the bottom surface 6a. The trench 6 extends on the foundation layer 3 such that a pattern corresponding to an electroconductive pattern layer which is formed in the subsequent step, is formed. In order to expose the foundation layer 3 to the bottom surface 6a of the trench 6, the trench formation layer 4 remaining on the foundation layer 3 in the trench 6 may be removed by etching such as dry etching, after the mold 7 is detached.

The mold 7 may be formed of quartz, Ni, ultraviolet ray curable liquid silicone rubber (PDMS), and the like. The shape of the convex portion 7a of the mold 7, that is, the shape of the trench 6 to be formed by the mold 7, is not particularly limited, and as illustrated in FIG. 1D, the lateral surfaces 6b and 6c may be inclined with respect to the bottom surface 6a, or the lateral surfaces 6b and 6c may be perpendicular to the bottom surface 6a, such that the width of the trench 6 is narrowed from a surface 4a of the trench formation layer 4 on a side opposite to the foundation layer 3 towards the bottom surface 6a. The lateral surfaces 6b and 6c may form a step.

In general, the width and the depth of the trench 6 are set to correspond to the width and the thickness of the electroconductive pattern layer which is formed in the subsequent step. Herein, the width of the trench indicates the maximum width in a direction perpendicular to a direction in which the trench extends. A ratio of the depth of the trench to the width of the trench, may be identical to an aspect ratio of the electroconductive pattern layer described below.

Next, as illustrated in FIG. 1E, an electroconductive pattern layer 8 filling the trench 6, is formed. The electroconductive pattern layer 8 may be formed by an electroless plating method of growing metal plating from the foundation layer 3. The electroconductive pattern layer 8 may be a layer formed of single metal plating, or may be configured of a plurality of metal platings having different metals. For example, the electroconductive pattern layer 8 may include a seed layer which is metal plating formed on the foundation layer 3, and one or more upper metal plating layers which are metal plating formed on a surface of the seed layer on a side opposite to the foundation layer 3. The electroconductive pattern layer 8 is the metal plating which is formed starting from the foundation layer, and thus, high adhesiveness with respect to the electroconductive pattern layer 8 and the foundation layer 3, is obtained. Accordingly, if an electroconductive substrate is repeatedly bent, the electroconductive pattern layer 8 can be prevented from being peeled off from the foundation layer 3, and excellent electroconductivity can be maintained.

The metal plating as the electroconductive pattern layer 8, for example, contains at least one type of metal selected from copper, nickel, cobalt, palladium, silver, gold, platinum, and tin, and preferably contains copper. The electroconductive pattern layer 8 may further contain a non-metal element such as phosphorus, within a range where suitable electroconductivity is maintained.

In a case where the electroconductive pattern layer 8 includes the seed layer and the upper metal plating layer, a metal configuring the seed layer and a metal configuring the upper metal plating layer may be identical to each other, or may be different from each other, and for example, the seed layer may contain nickel, and the upper metal plating layer may contain copper. The upper metal plating layer may include a copper plating layer formed on the seed layer, and an uppermost layer formed on the copper plating layer, containing gold or palladium.

The laminated body 5A in which the trench 6 is formed, is dipped in an electroless plating liquid containing a metal ion, and thus, the metal plating as the electroconductive pattern layer 8 can be formed starting from the catalyst contained in the foundation layer 3. The electroconductive pattern layer 8 filling the trench 6 is formed, and thus, the electroconductive substrate 1A can be obtained.

The electroless plating liquid contains the ion of the metal configuring the electroconductive pattern layer 8. The electroless plating liquid may further contain phosphorus, boron, iron, and the like.

The temperature of the electroless plating liquid at the time of dipping the laminated body 5A in the electroless plating liquid, for example, may be 40° C. to 90° C. In addition, a dipping time of the electroless plating liquid is different according to the thickness of the electroconductive pattern layer 8, and for example, is 10 minutes to 30 minutes.

The electroconductive pattern layer 8 extends on the foundation layer 3 such that a pattern corresponding to the trench 6 is formed. The thickness of the electroconductive pattern layer 8 may be substantially coincident with the thickness of the trench formation layer 4, and a ratio of the thickness of the electroconductive pattern layer 8 to the thickness of the trench formation layer 4 may be within a range of 0.8 to 1.2.

The width of the electroconductive pattern layer 8, may be greater than or equal to 1 µm, may be greater than or equal to 10 µm, or may be greater than or equal to 20 µm, and may be less than or equal to 90 µm, may be less than or equal to 70 µm, or may be less than or equal to 30 µm. Herein, the width of the electroconductive pattern layer indicates the maximum width in a direction perpendicular to an extending direction of the electroconductive pattern layer.

The width of the electroconductive pattern layer 8, may be greater than or equal to 0.3 µm, may be greater than or equal to 0.5 µm, or may be greater than or equal to 1.0 µm, and may be less than or equal to 5.0 µm, may be less than or equal to 4.0 µm, or may be less than or equal to 3.0 µm, from the viewpoint of improving the transparency of the electroconductive substrate.

The thickness of the electroconductive pattern layer 8, may be greater than or equal to 0.1 µm, may be greater than or equal to 1.0 µm, or may be greater than or equal to 2.0 µm, and may be less than or equal to 10.0 µm, may be less than or equal to 5.0 µm, or may be less than or equal to 3.0 µm.

The width and the thickness of the electroconductive pattern layer 8 can be adjusted by changing the design of the mold 7, and by changing the width and the thickness of the trench 6.

An aspect ratio of the electroconductive pattern layer 8, may be greater than or equal to 0.1, may be greater than or equal to 0.5, or may be greater than or equal to 1.0, and may be less than or equal to 10.0, may be less than or equal to 7.0, or may be less than or equal to 4.0. By setting the aspect ratio of the electroconductive pattern layer 8 to be in the range described above, it is possible to further increase the adhesiveness of the electroconductive pattern layer 8 with respect to the foundation layer 3, and to further increase the electroconductivity. The aspect ratio of the electroconductive pattern layer indicates a ratio of the thickness of the electroconductive pattern layer to the width of the electroconductive pattern layer (Thickness/Width).

The electroconductive pattern layer including the seed layer and the upper metal plating layer, can be formed by a method including forming the seed layer on the foundation layer, and forming the upper metal plating layer on the seed layer. The laminated body 5A in which the trench 6 is formed, is dipped in the electroless plating liquid for forming the seed layer, and thus, the metal plating is formed starting from the catalyst contained in the foundation layer 3, as the seed layer. After that, the laminated body including the seed layer is dipped in the electroless plating liquid for forming an electroconductive layer, and thus, the upper metal plating layer can be formed. The catalyst may be adsorbed in the seed layer before the upper metal plating layer is formed, and the upper metal plating layer may be formed starting from the catalyst adsorbed in the seed layer.

The thickness of the seed layer, may be greater than or equal to 10 nm, may be greater than or equal to 30 nm, or may be greater than or equal to 50 nm, and may be less than or equal to 500 nm, may be less than or equal to 300 nm, or may be less than or equal to 100 nm.

It is preferable that the electroconductive pattern layer 8 is formed such that gaps, such as gaps 11b and 11c in FIGS. 1E and 1F, are formed between at least a part of lateral surfaces 8b and 8c and the lateral surfaces 6b and/or 6c of the trench 6, respectively. Accordingly, it is possible to more effectively suppress a damage on the electroconductive pattern layer 8 if the electroconductive substrate 1A is bent. It is preferable that gaps 11b and 11c are formed between the lateral surfaces 8b and 8c of the electroconductive pattern layer 8 and both of the facing lateral surfaces 6b and 6c of the trench 6, respectively. The width of the gaps may be greater than or equal to 1 nm, may be greater than or equal to 5 nm, or may be greater than or equal to 10 nm, and may be less than or equal to 150 nm, may be less than or equal to 125 nm, or may be less than or equal to 100 nm. The width of the gaps indicates the maximum value of a distance between the electroconductive pattern layer 8 and the trench 6, in the direction perpendicular to the extending direction of the electroconductive pattern layer 8. The metal plating is grown from the foundation layer 3, or the seed layer on the foundation layer 3, and thus, it is possible to easily form the gaps between the electroconductive pattern layer 8 and the lateral surfaces 6b and 6c of the trench.

The electroconductive pattern layer 8, for example, may include a plurality of linear portions extending along a certain direction, and may form a mesh-like pattern.

The method of producing the electroconductive substrate of this embodiment, may further include a step of blackening at least a part of a surface of the electroconductive pattern layer 8, as necessary. For example, a surface 8a of the electroconductive pattern layer 8 on a side opposite to the bottom surface 6a of the trench 6 (hereinafter, also referred to as an upper surface 8a of the electroconductive pattern layer), a surface of the electroconductive pattern layer 8 on the bottom surface 6a side of the trench 6, or both thereof, may be blackened. In addition, the lateral surfaces 8b and 8c of the electroconductive pattern layer 8 may be blackened. Here, "blackening a surface" indicates that the surface is processed such that a normal reflectance with respect to light incident on the surface is reduced.

A method of blackening the surface of the electroconductive pattern layer 8 is not particularly limited, and examples of the method include a method of roughening the surface, and a method of covering the original surface with a layer absorbing more light than the original surface, in other words, a layer blacker than the original surface (hereinafter, referred to as a "blackened surface"). The blackened surface may be black metal plating which is formed by using a plating liquid for black metal plating, or may be black metal plating which is formed by a Raydent treatment (Registered Trademark). In general, the blackened surface is disposed as the electroconductive layer configuring a part of the electroconductive pattern layer 8.

Examples of the black metal plating which is formed by the plating liquid for the black metal plating, include black nickel plating, black chromium plating, black chromate of zinc plating, black rhodium plating, black ruthenium plating, alloy plating of tin-nickel-copper, alloy plating of tin-nickel, and substituted palladium plating.

For example, the black metal plating (for example, the black nickel plating) is formed on the foundation layer 3 as the seed layer, after the trench 6 is formed, and the upper metal plating layer is formed on the seed layer, and thus, the surface of the electroconductive pattern layer 8 on the bottom surface 6a side can be blackened. The black metal plating covering the surface 8a is formed, after the electroconductive pattern layer 8 is formed, and thus, the surface 8a of the electroconductive pattern layer 8 on the side opposite to the bottom surface 6a can be blackened. In a case where the gap is formed between the lateral surfaces 8b and 8c of the electroconductive pattern layer 8 and the lateral surfaces 6b and 6c of the trench 6, there are many cases where the black metal plating covering not only the surface 8a of the electroconductive pattern layer 8 on the side opposite to the bottom surface 6a of the trench 6, but also the lateral surfaces 8b and 8c of the electroconductive pattern layer 8, is formed by being dipped in the plating liquid for the black metal plating.

The thickness of the blackened surface (a film of the black metal plating), may be greater than or equal to 10 nm, may be greater than or equal to 30 nm, or may be greater than or equal to 50 nm, and may be less than or equal to 150 nm, may be less than or equal to 125 nm, or may be less than or equal to 100 nm.

In a case where the surface is blackened by the method of roughening the surface, the surface is roughened such that the surface roughness Ra is preferably greater than or equal to 15 nm. Ra is more preferably less than or equal to 60 nm. Ra can be measured by a scanning probe microscope (SPM). The roughening is performed by a method of roughening the surface of the electroconductive pattern layer 8 according to an acid treatment or the like, a method of forming the electroconductive pattern layer 8 such that the surface of the electroconductive pattern layer 8 is roughened, or the like.

The method of producing the electroconductive substrate of this embodiment, may further include a step of forming a protective film 12 covering at least a part of a surface of the trench formation layer 4 and the electroconductive pattern layer 8 on a side opposite to the base material 2, as necessary. The protective film, for example, may contain a resin or a filler. Examples of the resin of the protective film, include an amino resin, an isocyanate resin, a silicon resin, an acrylic resin, a polycarbonate resin, a fluorine resin, and an ultraviolet ray curable resin having an unsaturated double bond, or a functional group causing a polymerization reaction by an ultraviolet ray, such as cyclic ether and vinyl ether, and the like. Examples of the filler of the protective film, include silicon oxide, zirconium oxide, titanium oxide, aluminum oxide, magnesium fluoride zinc oxide, antimony oxide, phosphorus doped tin oxide, antimony doped tin oxide, tin doped indium oxide, Ag nano-colloid, and the like. For example, a resin composition for forming the protective film is applied to the surface of the trench formation layer 4 and the electroconductive pattern layer 8 on the side opposite to the base material 2, and the coated film is dried and/or cured, as necessary, and thus, the protective film can be formed. In a case where the gap is formed between the electroconductive pattern layer 8 and the lateral surfaces 6b and 6c of the trench 6, the protective film may fill the gap.

The thickness of the protective film, may be greater than or equal to 10 nm, may be greater than or equal to 50 nm, or may be greater than or equal to 100 nm, and may be less than or equal to 5000 nm, may be less than or equal to 3000 nm, or may be less than or equal to 1000 nm.

A refractive index of the protective film, may be greater than or equal to 1.0, or may be greater than or equal to 1.3, and may be less than or equal to 1.6, or may be less than or equal to 1.5, from the viewpoint of the transparency of the electroconductive substrate. It is preferable that the refractive index of the protective film is less than the refractive index of the trench formation layer 4. The refractive index of the protective film, for example, can be adjusted by increasing and decreasing the content of the filler.

Figure 2B:
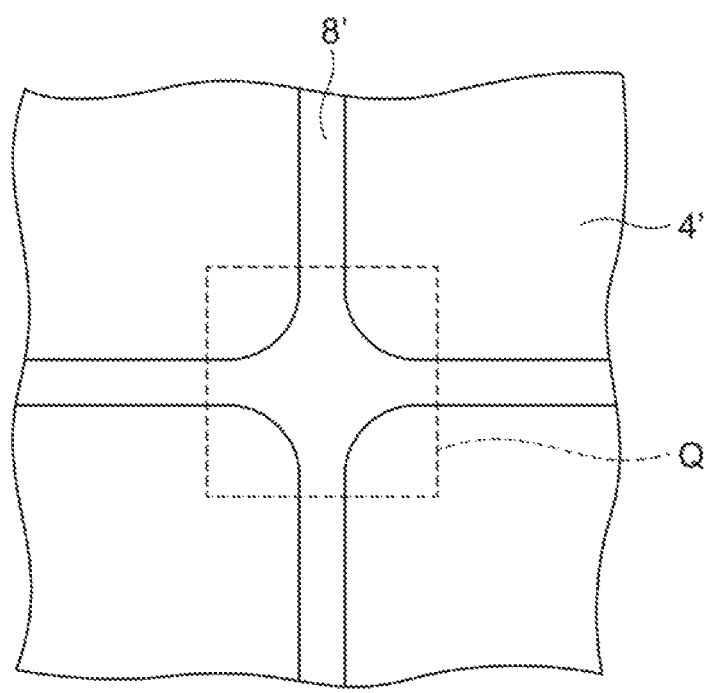
FIG. 2B is a partially enlarged view illustrating an example of an electroconductive substrate of the related art.

The method according to this embodiment is excellent from the viewpoint of enabling the electroconductive pattern layer having a constant width to be easily formed. FIGS. 2A and 2B are partially enlarged views illustrating an example of the electroconductive substrate including the electroconductive pattern layer forming the mesh-like pattern. In a case of the electroconductive substrate which is formed by the method according to this embodiment, as exemplified in FIG. 2A, the width of the electroconductive pattern layers 8 is not greatly changed even in a region P in the vicinity of an intersection between two electroconductive pattern layers 8, and a constant width is easily maintained. In contrast, in a case of a method of the related art in which the electroconductive pattern layer is formed by etching, as exemplified in FIG. 2B, there is a case where the width of the electroconductive pattern layer 8' increases in a region Q in the vicinity of an intersection between two electroconductive pattern layers 8'. The fact that the width of the electroconductive pattern layer 8 does not increase in the region in the vicinity of the intersection, is advantageous from the viewpoint of increasing a total light transmittance, and the fact that a variation in the width of the electroconductive pattern layer 8 is small, is advantageous from the viewpoint of decreasing a variation in the total light transmittance.

Further, in the method according to this embodiment, it is not necessary to remove the extra electroconductive material according to etching, and thus, it is possible to reduce the number of steps.

Second Embodiment

FIGS. 3A to 3F are sectional views schematically illustrating a method of producing an electroconductive substrate 1B according to a second embodiment. The same reference numerals will be applied to configurations and portions corresponding to those of the method according to the first embodiment of FIGS. 1A to 1F, and the repeated description thereof will be omitted.

The method according to this embodiment is different from the method according to the first embodiment, in that a step of adsorbing a catalyst 10 in a foundation layer 9 which is exposed to the bottom surface 6a of the trench 6 (FIG. 3E) after the step of forming the trench 6, and the metal plating as the electroconductive pattern layer 8 is grown from the foundation layer 9 in which the catalyst 10 is adsorbed.

Figure 3A:
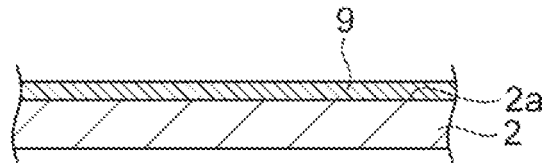
FIGS. 3A to 3F are sectional views schematically illustrating a method of producing an electroconductive substrate according to a second embodiment.
Figure 3B:
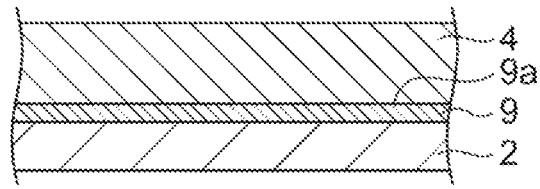
Figure 3C:
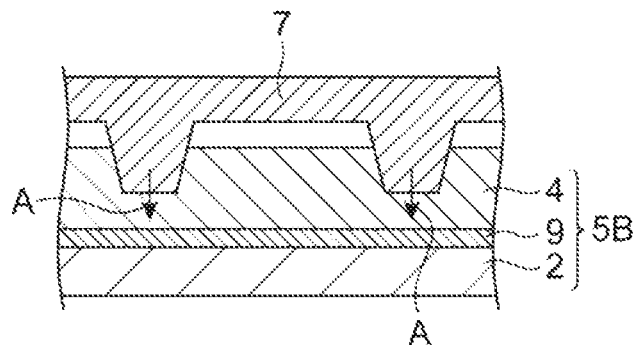
Figure 3D:
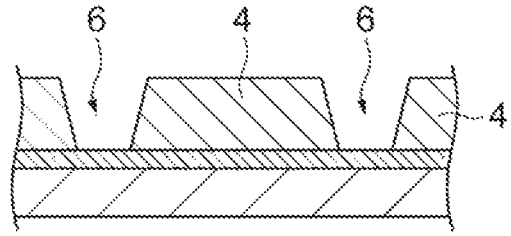
Figure 3E:
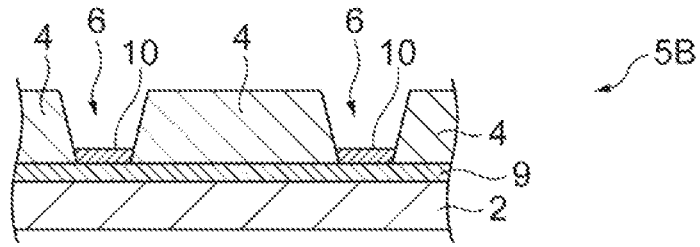
Figure 3F:
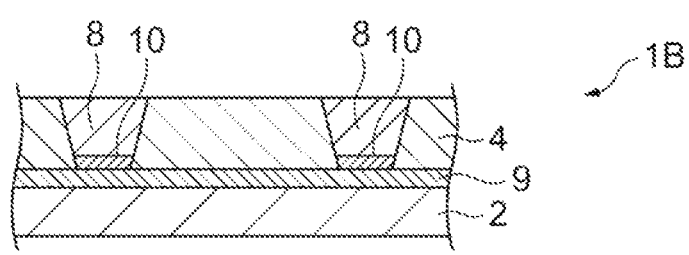

As illustrated in FIG. 3A, in general, the foundation layer 9 which is formed on the main surface 2a of the base material 2, is a layer which does not contain the catalyst, but is capable of adsorbing the catalyst. The foundation layer 9 may be formed of a resin such as polyacetylene, polyacene, polyparaphenylene, polyparaphenylene vinylene, polypyrrole, polyaniline, polythiophene, and various derivatives thereof, or the like. The catalyst adsorbed in the foundation layer 9, can be the same electroless plating catalyst as that of the first embodiment. For example, a laminated body including the trench 6 including the bottom surface 6a to which the foundation layer 9 is exposed, is dipped in an aqueous solution containing the catalyst, and thus, the catalyst can be adsorbed in the foundation layer 9. The other steps are identical to those of the first embodiment.

[Display Device]

A light emitting element is mounted on the electroconductive substrate produced by the method described above, and thus, it is possible to produce a display device including the electroconductive substrate and the light emitting element. In the electroconductive substrate described above, the electroconductive pattern layer is prevented from being peeled off from the foundation layer, and thus, the display device including such an electroconductive substrate is produced to be thin like cloth or paper, and can be used as a flexible display device (display) which is capable of being folded or rolled. Such a flexible display device can be reduced in the size and the weight, and the storability and the designability thereof can be improved.

Figure 4A:
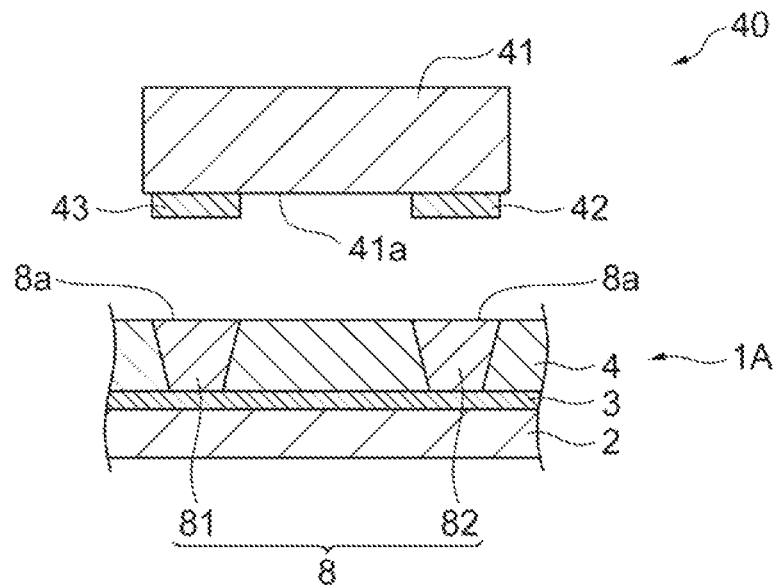
FIGS. 4A and 4B are sectional views schematically illustrating one embodiment of a method of producing a display device.
Figure 4B:
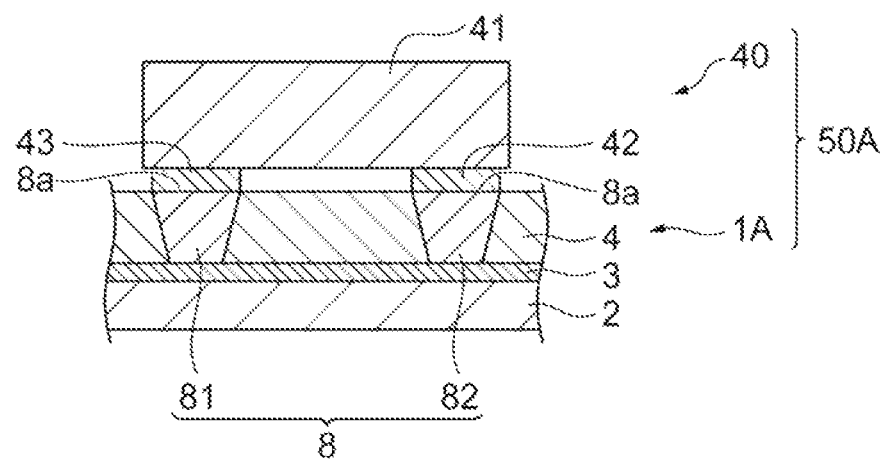

FIGS. 4A and 4B are sectional views schematically illustrating one embodiment of a method of producing the display device. In this method, first, as illustrated in FIG. 4A, a light emitting element 40 and the electroconductive substrate 1A are prepared. The light emitting element 40 includes a light emitting unit 41, a positive electrode 42 disposed on one main surface 41a of the light emitting unit 41, and a negative electrode 43 disposed on the main surface 41a with a space from the positive electrode 42. Hereinafter, the positive electrode 42 and the negative electrode 43 may be collectively referred to as electrodes 42 and 43. The light emitting element 40 may be an element which is capable of emitting red light, green light, or blue light. The light emitting element 40, for example, may be a light emitting diode (LED). In this embodiment, the electroconductive pattern layer 8 of the electroconductive substrate 1A, includes a plurality of linear portions 81 and 82 extending along a certain direction.

The shape of the light emitting element 40 (the shape of the light emitting unit 41) is not particularly limited, and for example, may be an approximately quadrangular shape (a rectangular shape, a square shape, and the like). The dimension of the light emitting element 40 may be suitably set, and in a case where the light emitting element 40 has a quadrangular shape, it is preferable that the width of the light emitting element 40, is less than or equal to 100 µm, is less than or equal to 80 µm, is less than or equal to 60 µm, is less than or equal to 30 µm, or is less than or equal to 20 µm, from the viewpoint of further improving the resolution of the display device. In this case, it is preferable that the length of the light emitting element 40, is less than or equal to 50 µm, is less than or equal to 40 µm, is less than or equal to 30 µm, is less than or equal to 20 µm, or is less than or equal to 10 µm. The width of the light emitting element 40, may be greater than or equal to 5 µm, may be greater than or equal to 10 µm, or may be greater than or equal to 20 µm. In this case, the length of the light emitting element 40, may be greater than or equal to 5 µm, or may be greater than or equal to 10 µm. When the light emitting element 40 is mounted on the electroconductive substrate 1A in a step described below, the width of the light emitting element 40 is set as a direction corresponding to the width of the electroconductive pattern layer 8. The length of the light emitting element 40 is set as a direction along the extending direction of the electroconductive pattern layer 8.

Next, as illustrated in FIG. 4B, the light emitting element 40 is mounted on the electroconductive substrate 1A. Such a step includes connecting the electrodes 42 and 43 of the light emitting element 40 to the electroconductive pattern layer 8 of the electroconductive substrate 1A. At this time, the positive electrode 42 and the negative electrode 43 of the light emitting element 40 are respectively brought into contact with two adjacent linear portions 81 and 82 of the electroconductive pattern layer 8, and thus, the light emitting element 40 is electrically connected to the electroconductive pattern layer 8. Accordingly, it is possible to obtain a display device 50A in which the light emitting element 40 is mounted on the electroconductive substrate 1A.

Figure 5A:
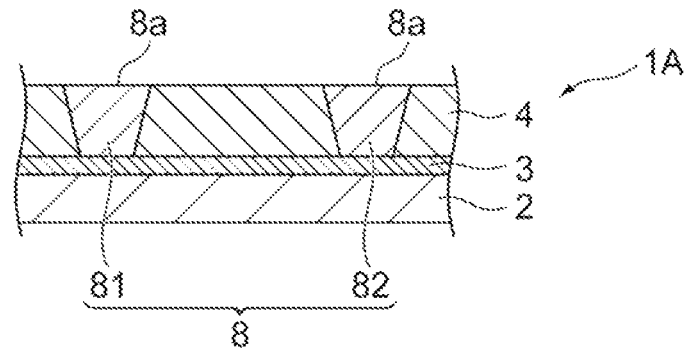
FIGS. 5A to 5C are sectional views schematically illustrating another embodiment of the method of producing the display device.
Figure 5B:
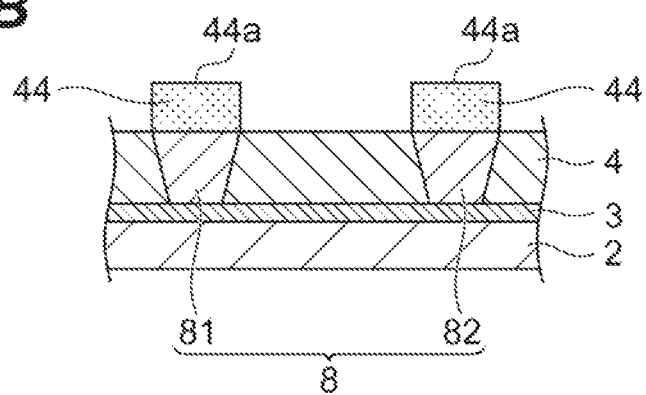
Figure 5C:
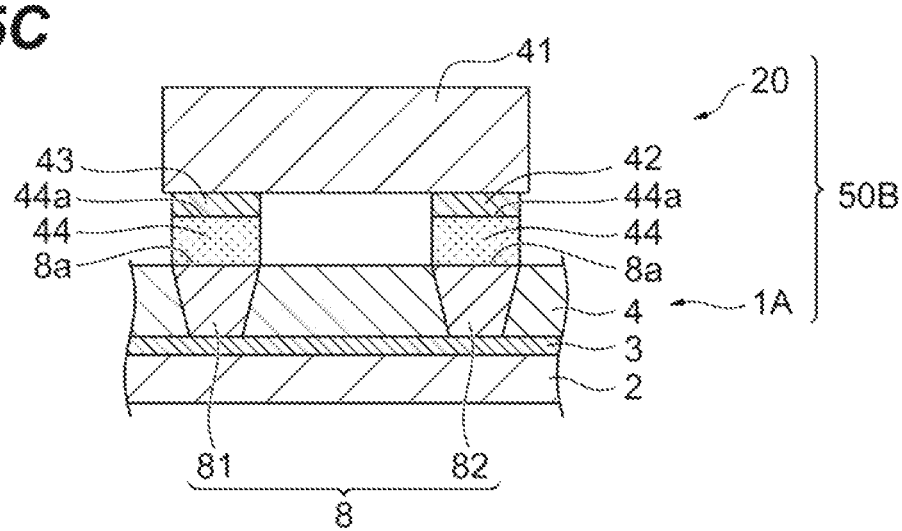

FIGS. 5A to 5C are sectional views schematically illustrating another embodiment of the method of producing the display device. Such a method is different from the method of the embodiment described above, in that the step of mounting the light emitting element 40 on the electroconductive substrate 1A, includes forming a connection portion on the electroconductive pattern layer 8 of the electroconductive substrate 1A, and connecting the light emitting element 40 to the electroconductive pattern layer 8 through the connection portion.

In this method, first, as illustrated in FIG. 5A and FIG. 5B, the connection portion 44 is formed on the electroconductive pattern layer 8 of the electroconductive substrate 1A. The connection portion 44 may be formed to be in contact with at least a part on the upper surface 8a of the electroconductive pattern layer 8.

The connection portion 44 may be formed on the upper surface 8a of the electroconductive pattern layer 8 by using a fine ball formed of a solder alloy, or may be formed by printing a paste formed of a solder alloy. The connection portion 44 may be formed according to an electroless plating method of growing the metal plating from the electroconductive pattern layer 8. In a case where the connection portion 44 is formed according to the electroless plating method, the connection portion 44 may contain tin, silver, copper, bismuth, indium, and the like, or may contain an alloy of any two or more materials, as a configuration material. In this embodiment, it is preferable that the connection portion 44 is formed by a fine ball or a paste, formed of a solder alloy.

The dimension of the connection portion 44 may be suitably set insofar as being a size in which the electrodes 42 and 43 of the light emitting element 40 can be in contact with the connection portion 44. For example, as illustrated in FIG. 5B, the connection portion 44 may be formed such that the width thereof is identical to the width of the electroconductive pattern layer 8. The connection portion 44 may be formed such that the width thereof is smaller than the width of the electroconductive pattern layer 8, and a part of the upper surface 8a of the electroconductive pattern layer 8 may be exposed.

Next, as illustrated in FIG. 5C, the electrodes 42 and 43 of the light emitting element 40 are brought into contact with a surface 44a of the connection portion 44 on a side opposite to a surface in contact with the electroconductive pattern layer 8, and thus, the light emitting element 40 is connected to the electroconductive substrate 1A through the connection portion 44. At this time, the positive electrode 42 and the negative electrode 43 of the light emitting element 40 are brought into contact with two adjacent connection portions 44, and thus, the light emitting element 40 is electrically connected to the electroconductive substrate 1A. Accordingly, it is possible to obtain a display device 50B in which the light emitting element 40 is mounted on the electroconductive substrate 1A.

FIGS. 6A to 6F are sectional view schematically illustrating one modification example of the method of producing the display device, including connecting the light emitting element 40 to the electroconductive substrate 1A through the connection portion 44. According to this modification example, it is possible to more suitably and easily mount the light emitting element 40 on the electroconductive substrate 1A, and thus, this modification example is particularly preferably used in a case where a smaller light emitting element 40 is mounted on the electroconductive substrate 1A.

Figure 6A:
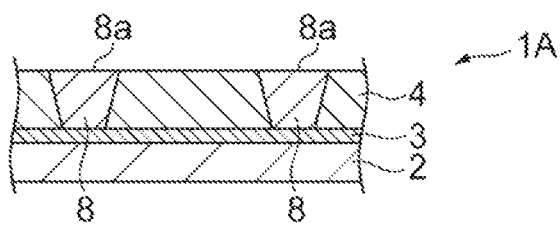
FIGS. 6A to 6F are sectional views schematically illustrating a modification example of the method illustrated in FIGS. 5A to 5C.
Figure 6B:
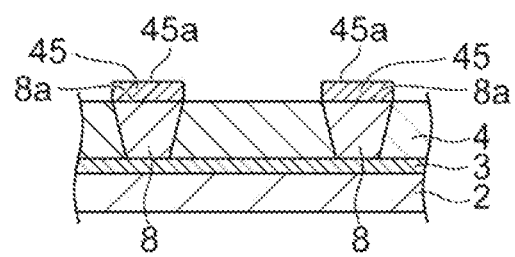

In this method, first, as illustrated in FIG. 6A and FIG. 6B, an adhesion layer 45 is formed on the electroconductive pattern layer 8 of the electroconductive substrate 1A. The adhesion layer 45 may be formed in at least a part of the upper surface 8a of the electroconductive pattern layer 8. The adhesion layer 45 is formed, and thus, when an insulating layer described below is formed on the trench formation layer 4 and the electroconductive pattern layer 8, it is possible to prevent the insulating layer from being peeled off.

It is preferable that the adhesion layer 45 is formed according to the electroless plating method of growing the metal plating from the electroconductive pattern layer 8. It is preferable that the adhesion layer 45 contains at least one type selected from the group consisting of nickel and a nickel alloy, as a configuration material, from the viewpoint of improving adhesiveness with respect to a UBM layer described below, and the connection portion 44 and the light emitting element 40 formed on the UBM layer. It is more preferable that the adhesion layer 45 contain at least one type selected from the group consisting of zinc and phosphorus, in addition to at least one type selected from the group consisting of nickel and a nickel alloy.

It is preferable that a surface 45a of the adhesion layer 45 on a side opposite to a surface in contact with the electroconductive pattern layer 8 (hereinafter, also referred to as an upper surface 45a of the adhesion layer 45) is roughened. The upper surface 45a of the adhesion layer 45 is roughened, and thus, the insulating layer described below more easily adheres to the upper surface 45a of the adhesion layer 45 according to an anchor effect.

A method of roughening the upper surface 45a of the adhesion layer 45, is performed by a method of roughening the upper surface 45a of the adhesion layer 45 after plating according to an acid treatment and the like, a method of forming the adhesion layer 45 after the plating liquid is adjusted such that a surface of the adhesion layer 45 is roughened, or the like.

Surface roughness Ra of the adhesion layer 45 is preferably greater than or equal to 0.1 µm, is more preferably greater than or equal to 0.3 µm, and is even more preferably greater than or equal to 0.5 µm, from the viewpoint of further improving the adhesiveness with respect to the insulating layer described below. Ra is preferably less than or equal to 1 µm, is more preferably less than or equal to 0.8 µm, and is even more preferably less than or equal to 0.7 µm, from the viewpoint of ensuring the strength of the display device. Ra can be measured by the same measurement method as the method described in the blackened surface.

The thickness of the adhesion layer 45 is preferably greater than or equal to 0.1 µm, is more preferably greater than or equal to 0.5 µm, and is even more preferably greater than or equal to 1.0 µm, from the viewpoint of obtaining suitable surface roughness Ra. The thickness of the adhesion layer 45, may be less than or equal to 2.0 µm, may be less than or equal to 1.8 µm, or may be less than or equal to 1.5 µm.

Figure 6C:
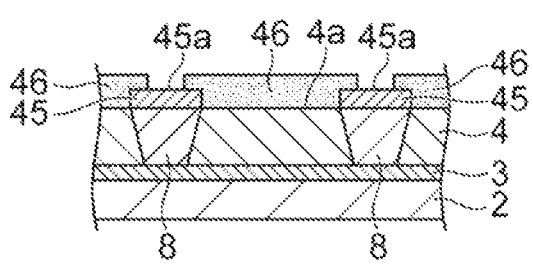

Subsequently, as illustrated in FIG. 6C, an insulating layer 46, covering the surface 4a of the trench formation layer 4 on the side opposite to the foundation layer 3, and including an opening portion to which the upper surface 45a of the adhesion layer 45 is exposed, is formed. It is preferable that the insulating layer 46 is formed to cover the surface 4a of the trench formation layer 4, and a part of the adhesion layer 45 (for example, an end portion of the upper surface 45a of the adhesion layer 45).

The insulating layer 46 is formed of a material having insulating properties. The material having the insulating properties may be an inorganic material or a resin. Examples of the inorganic material include a compound containing silicon, such as $SiO_2$ and SiN. Examples of the resin include an epoxy resin, polyimide, and the like.

Figure 6D:
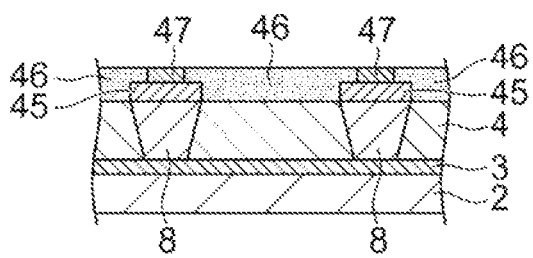

As illustrated in FIG. 6D, a UBM layer (under-barrier metal layer) 47 is formed on the upper surface 45a of the adhesion layer 45, which is exposed into the opening portion of the insulating layer 46. It is preferable that the UBM layer 47 is formed according to an electroless plating method of growing the metal plating from the adhesion layer 45. The UBM layer 47 may contain at least type of metal selected from the group consisting of nickel, cobalt, iron, and copper. The UBM layer 47 may further contain a non-metal element such as phosphorus. It is preferable that the UBM layer 47 contains nickel, or contains nickel and phosphorus.

Figure 6E:
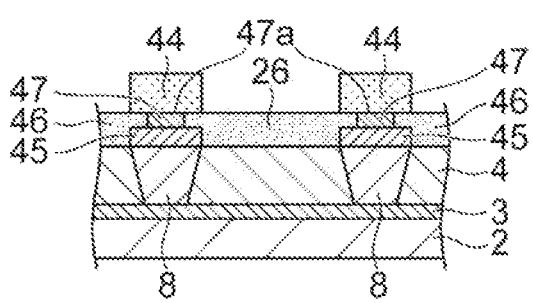

As illustrated in FIG. 6E, the connection portion 44 is formed on a surface 47a of the UBM layer 47 on a side opposite to the electroconductive substrate 1A. A configuration material and a forming method of the connection portion 44 may be identical to the configuration material and the forming method of the embodiment described above, and in this modification example, it is preferable that the connection portion 44 is formed according to an electroless plating method of growing the metal plating from the UBM layer 47, from the viewpoint of mounting a smaller light emitting element 40. It is preferable that the connection portion 44 contains tin or an alloy thereof, as a configuration material. A part of the connection portion 44 to be formed on the UBM layer 47, may be in contact with a surface of the insulating layer 46.

Figure 6F:
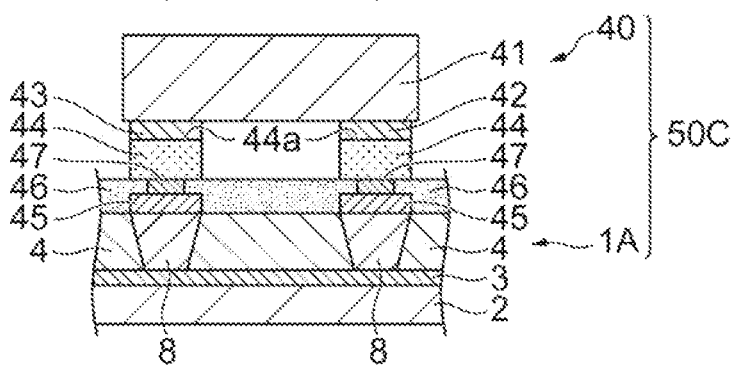

As illustrated in FIG. 6F, the light emitting element 40 is connected to the formed connection portion 44. Accordingly, it is possible to obtain a display device 50C in which the light emitting element 40 is connected to the electroconductive pattern layer 8 of the electroconductive substrate 1A through the connection portion 44, the UBM layer 47, and the adhesion layer 45. That is, the light emitting element 40 is mounted on the electroconductive substrate 1A, according to the step including forming the adhesion layer 45, the insulating layer 46, the UBM layer 47, and the connection portion 44, and connecting the light emitting element 40 to the connection portion 44.

Figure 7:
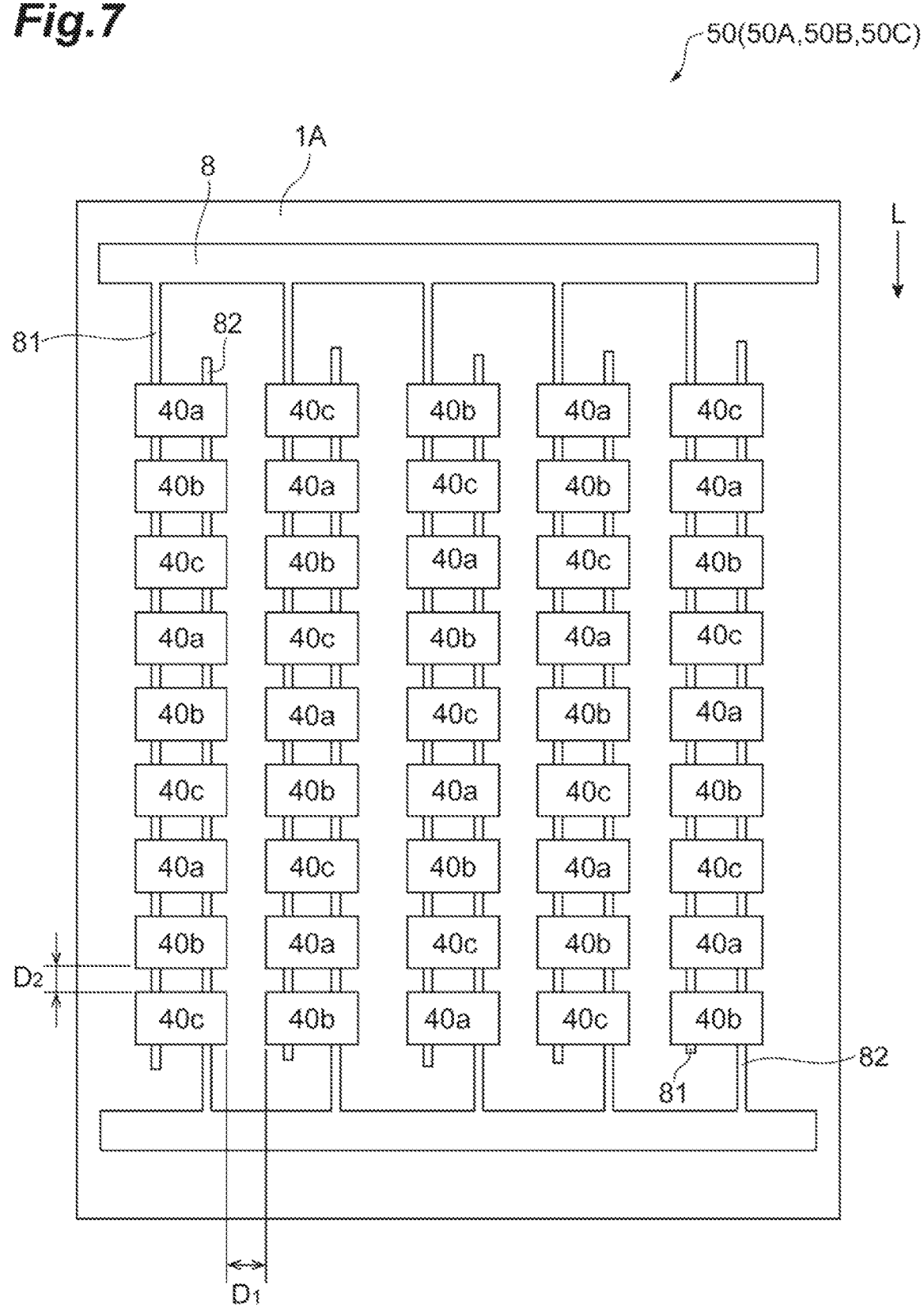
FIG. 7 is a plan view schematically illustrating a main part of the display device which is obtained according to the method illustrated in FIGS. 4A to 6F.

FIG. 7 is a plan view schematically illustrating a main part of a display device 50 (50A to 50C) which is obtained according to the method illustrated in FIGS. 4A to 6F. In the display device 5 illustrated in FIG. 7, a plurality of light emitting elements 40 (40a, 40b, and 40c) are arranged along an extending direction L of two adjacent linear portions while straddling two adjacent linear portions 81 and 82 of the electroconductive pattern layer 8 of the electroconductive substrate 1A. The light emitting element 40 may be configured of a light emitting element 40a including a red light emitting unit, a light emitting element 40b including a green light emitting unit, and a light emitting element 40c including a blue light emitting unit, and such light emitting elements 40a, 40b, and 40c may be arranged in an arbitrary order. For example, a distance $D_1$ in a width direction of the electroconductive pattern layer 8 may be less than or equal to 400 µm, and a distance $D_2$ in the extending direction L of the electroconductive pattern layer 8 may be less than or equal to 200 µm, as a distance between the adjacent light emitting elements 40 (40a, 40b, and 40c).

In the method of producing the display device 50 described above, a step of disposing a sealing portion covering an exposed portion of the light emitting element 40, may be further provided. The sealing portion, for example, may be formed of a resin such as a silicone resin, an epoxy resin, and an olefin resin.

It is also possible to mount the light emitting element on the electroconductive substrate 1B which is produced by the method according to the second embodiment, according to the same method as that of the first embodiment, and to produce the display device.

[Electronic Device]

In another embodiment, an electronic component other than the light emitting element can be mounted on the electroconductive substrate which is produced by the method described above. Examples of the electronic component other than the light emitting element, include a passive component such as a capacitor, an inductor, and a thermistor, a semiconductor element, a connector, and the like. Accordingly, it is possible to produce an electronic device including an electronic component on the electroconductive substrate which is produced by the method described above, in addition to the display device.

EXAMPLES

Hereinafter, the present invention will be specifically described by examples, but the present invention is not limited to the examples.

Example 1

A catalyst-containing resin for forming a foundation layer forming, containing 20 mass % of Pd particles, and an isocyanate resin, was prepared. The catalyst-containing resin was applied onto a PET film (a thickness of 100 µm), which is a transparent base material, by using a bar coater. The coated film was heated at 80° C., and was cured, and thus, the foundation layer (a thickness of 100 nm) was formed.

After that, an ultraviolet ray curable transparent acryl-based oligomer was applied onto the foundation layer, by using a bar coater, and thus, a trench formation layer (a thickness of 2 μm) was formed.

An Ni mold in which a mesh-like pattern was formed and a convex portion having a width of 1 μm was provided, was prepared. The mold was pressed against the trench formation layer, and a tip end of the convex portion of the mold reached the foundation layer. In such a state, the trench formation layer was cured by being irradiated with an ultraviolet ray. Accordingly, a trench including a bottom surface to which the foundation layer was exposed, was formed. The width of the trench was 1 μm, the depth of the trench was 2 μm, and a distance between adjacent trenches was 100 μm.

A laminated body including the trench formation layer in which the trench was formed, was dipped in an alkaline degreasing liquid containing a surfactant, for 5 minutes. After that, the laminated body taken out from the degreasing liquid, was washed with pure water. The laminated body after being washed, was dipped in an electroless plating liquid containing nickel sulfate and sodium hypophosphite, for 3 minutes, and metal plating as a seed layer (a thickness of 100 nm) formed of Ni and P, was grown from the foundation layer which was exposed to the bottom surface of the trench. The laminated body taken out from the electroless plating liquid, was washed with pure water. Subsequently, the laminated body in which the seed layer was formed, was dipped in an aqueous solution containing Pd, for 5 minutes, and then, was washed with pure water, and the Pd particles as a catalyst were adsorbed in the seed layer. After that, the laminated body was dipped in an electroless plating liquid containing copper sulfate and formalin, for 5 minutes, and thus, Cu plating (an upper metal plating layer) filling the trench, was grown on the seed layer. The laminated body taken out from the electroless plating liquid, was washed with pure water, and was dried at 80° C. for 3 minutes, and a mesh-like pattern was formed, and thus, an electroconductive substrate including an electroconductive pattern layer formed of the seed layer and the Cu plating, was obtained. In the electroconductive substrate, a width W of the electroconductive pattern layer was 1 μm, the thickness of the electroconductive pattern layer was 2 μm, and an aspect ratio (Thickness/Width) of the electroconductive pattern layer was 2. A distance S between adjacent electroconductive pattern layers was 200 μm. In the obtained electroconductive substrate, a sectional surface of the electroconductive pattern layer was cut out by using a cross-section polisher, and it was confirmed that a gap was formed between a lateral surface of the trench and a lateral surface of the electroconductive pattern layer, according to observation using an electron scanning microscope.

Examples 2 to 5

An electroconductive substrate was prepared by the same method as that in Example 1, except that the width W of the electroconductive pattern layer (the width of the trench) and the thickness of the electroconductive pattern layer (the depth of the trench) was changed to the values shown in Table 1.

Examples 6 to 9

An electroconductive substrate was prepared by the same method as that in Example 1, except that the thickness of the electroconductive pattern layer (the depth of the trench) was changed to the values shown in Table 1.

Comparative Example 1

Figure 8A:
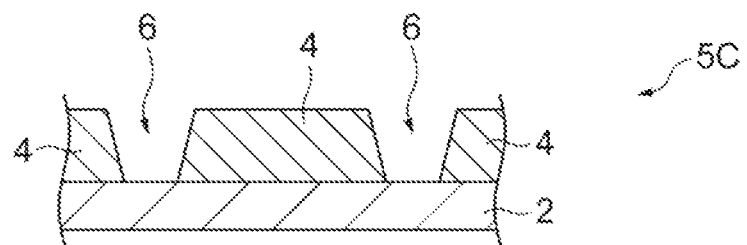
FIGS. 8A to 8D are process charts illustrating a method of producing an electroconductive substrate of the related art.
Figure 8B:
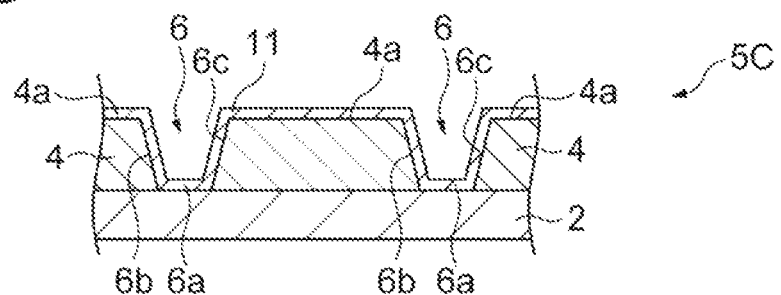
Figure 8C:
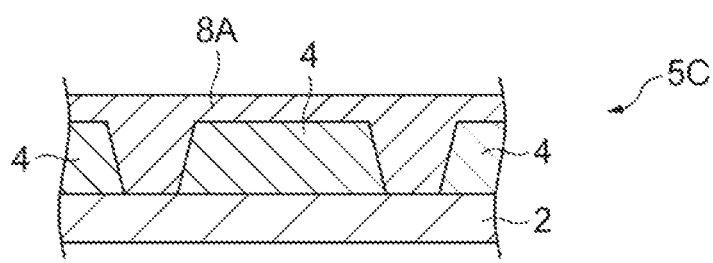
Figure 8D:
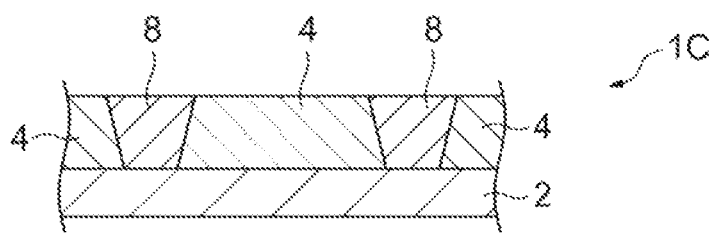

An electroconductive substrate not including the foundation layer, was prepared according to a production method of the related art illustrated in FIGS. 8A to 8D. First, an ultraviolet ray curable transparent acryl-based oligomer was applied onto the same PET film (the base material 2) as that of the examples, and the trench formation layer 4 (a thickness of 2 μm) was formed. A mold in which a mesh-like pattern was formed and a convex portion having a width of 1 μm was provided, was pressed against the trench formation layer 4, and a tip end of the convex portion reached the base material 2. In such a state, the trench formation layer 4 was cured by being irradiated with an ultraviolet ray, and thus, a laminated body 5C was obtained in which the trench 6 including the bottom surface to which the base material 2 was exposed, was formed (FIG. 8A). Next, a seed layer 11 formed of Cu, covering the entire surface 4a of the trench formation layer 4 and the entire bottom surface 6a, was formed by a sputtering method (FIG. 8B). After that, the laminated body 5C was dipped in an electroless plating liquid containing copper sulfate and formalin, and thus, Cu plating was grown from the seed layer 11, and a Cu plating layer 8A which filled the trench 6 and covered the entire trench formation layer 4, was formed (FIG. 8C). After that, a portion of the Cu plating layer 8A, other than a portion filling the inside of the trench 6, was removed by etching (FIG. 8D), and thus, an electroconductive substrate 1C according to Comparative Example 1, including the electroconductive pattern layer 8, was prepared. In the obtained electroconductive substrate, the sectional surface of the electroconductive pattern layer was cut out by using a cross-section polisher, and it was confirmed that the electroconductive pattern layer 8 adhered to the lateral surfaces 6b and 6c of the trench 6, and a gap was not formed therebetween, according to observation using an electron scanning microscope.

<Bending Test>

Figure 9:
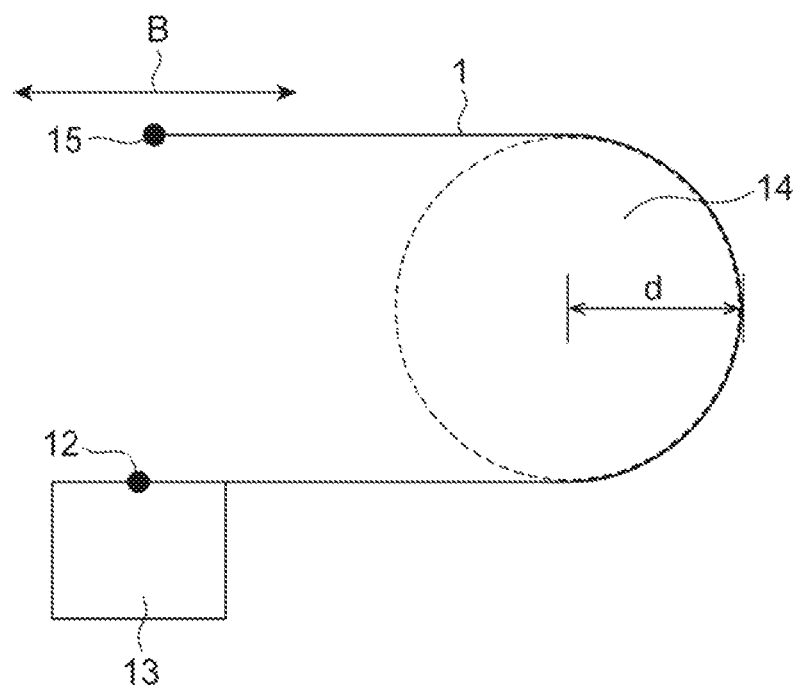
FIG. 9 is a schematic view of a bending resistance testing machine.

A sample of each electroconductive substrate having a length of 150 mm and a width of 50 mm, was prepared. The sample was subjected to a bending test according to JISC5016, using a bending resistance testing machine illustrated in FIG. 9. That is, the electroconductive substrate 1 was set to conform to a circular circumferential surface (Curvature Radius d: 5 mm) of a bent portion 14 while fixing an end portion 12 of the electroconductive substrate 1 to a fixation portion 13, and thus, the electroconductive substrate 1 was disposed to be bent. After that, an end portion 15 on a side opposite to the end portion 12 was moved back and forth along a direction illustrated by an arrow B. A movement distance that the end portion 15 was moved back and forth, was set to 30 mm, and a back and forth cycle was set to 150 times/minute, and thus, the end portion 15 was repeatedly moved back and forth for 1 minute.

<Evaluation of Electroconductivity (Measurement of Surface Resistance)>

Surface resistance of each of the electroconductive substrates before and after the bending test was measured by using a non-contact type resistance measuring instrument EC-80P (manufactured by NAPSON CORPORATION). The measurement was performed in a region of φ20 mm of a surface of the electroconductive substrate. Electroconductivity was evaluated in the following four ranks, on the basis of the measurement result. A rank A indicates that the electroconductivity is most excellent.

Rank A: The surface resistance is less than 5Ω/square

Rank B: The surface resistance is greater than or equal to 5 Ω/square and less than 10Ω/square Rank C: The surface resistance is greater than or equal to 10 Ω/square and less than 15Ω/square Rank D: The surface resistance is greater than or equal to 15 Ω/square <Evaluation of Adhesiveness>

A sectional surface of the electroconductive substrate after the bending test, was observed with an electron scanning microscope, and the presence or absence of the peeling of the electroconductive pattern layer from the foundation layer or the base material was confirmed.

<Evaluation of Transparency>

A total light transmittance of the electroconductive substrate was measured according to JISK7136, using a haze meter NDH5000 (manufactured by NIPPON DENSHOKU INDUSTRIES CO., LTD.). The transparency of the transparent electroconductive substrate was evaluated in the following three ranks, with respect to the measurement result. A rank A indicates that the transparency is most excellent.

Rank A: Total Light Transmittance of Electroconductive Substrate/Total Light Transmittance of Base Material×100=greater than or equal to 98%

Rank B: Total Light Transmittance of Electroconductive Substrate/Total Light Transmittance of Base Material×100=greater than or equal to 96% and less than 98%

Rank C: Total Light Transmittance of Electroconductive Substrate/Total Light Transmittance of Base Material×100=less than 96%

TABLE 1

| | Electroconductive pattern layer (trench) | | | | Evaluation result | | After bending test | |
|---|---|---|---|---|---|---|---|---|
| | W/S (μm) | Thickness (μm) | Aspect ratio | Presence of absence of gap | Transparency | Electroconductivity | Peeling (adhesiveness) | Electroconductivity |
| Example 1 | 1/200 | 2 | 2 | Present | B | B | Absent | B |
| Example 2 | 0.3/200 | 0.6 | 2 | Present | A | C | Absent | C |
| Example 3 | 0.5/200 | 1 | 2 | Present | A | B | Absent | B |
| Example 4 | 3/200 | 6 | 2 | Present | B | A | Absent | A |
| Example 5 | 3.5/200 | 7 | 2 | Present | C | A | Absent | A |
| Example 6 | 1/200 | 4.5 | 4.5 | Present | C | A | Absent | A |
| Example 7 | 1/200 | 4 | 4 | Present | B | A | Absent | A |
| Example 8 | 1/200 | 1 | 1 | Present | B | B | Absent | B |
| Example 9 | 1/200 | 0.5 | 0.5 | Present | A | B | Absent | C |
| Comparative Example 1 | 1/200 | 2 | 2 | Absent | B | B | Present | D |

As shown in Table 1, in the electroconductive substrates of Examples 1 to 9, it was found that the electroconductive pattern layer after the bending test was prevented from being peeled off, and excellent electroconductivity was maintained.

Examples 10 to 12

A plurality of electroconductive substrates were prepared by the same method as that in Example 1. Such electroconductive substrates were dipped in an aqueous solution containing Pd, for 5 minutes, and then, were washed with pure water, and thus, the Pd particles as the catalyst were adsorbed in the surface of the electroconductive pattern layer. After that, the electroconductive substrate was dipped in an electroless plating liquid for black Ni plating, for 3 minutes, and thus, a black Ni plating film was formed as the uppermost layer of the electroconductive pattern layer on a side opposite to the bottom surface of the trench and the lateral surface side of the trench. Each of the electroconductive substrates taken out from the electroless plating liquid, was washed with pure water. Further, the black Ni plating film was subjected to an acid treatment, surface roughness Ra of the black Ni plating film was adjusted to be 15 nm (Example 10), 58 nm (Example 11, or 65 nm (Example 12), by adjusting the time of the acid treatment. Ra was measured in a visual field of 1 μm, by using a scanning probe microscope. Ra of the electroconductive pattern layer of Example 1 was 8 nm.

<Evaluation of Electroconductivity and Measurement of Transmittance>

In the electroconductive substrates of Examples 10 to 12 and Example 1, the transparency and the electroconductivity were evaluated by the same method as the method described above. As shown in Table 2, it was found that when Ra was 15 nm to 60 nm, the transparency and the electroconductivity were particularly excellent.

TABLE 2

| | Electroconductive pattern layer (trench) | | | Evaluation result | |
|---|---|---|---|---|---|
| | W/S (μm) | Thickness (μm) | Ra (nm) | Transparency | Electro-conductivity |
| Example 1 | 1/200 | 2 | 8 | B | B |
| Example 10 | 1/200 | 2 | 15 | A | B |
| Example 11 | 1/200 | 2 | 58 | A | B |
| Example 12 | 1/200 | 2 | 65 | A | C |

Examples 13 to 15

A plurality of electroconductive substrates were prepared by the same method as that in Example 1. A curable resin composition for forming a protective film was applied onto the surface of the trench formation layer and the electroconductive pattern layer of such electroconductive substrates, with a doctor blade. The coated film was dried, and then, was cured by being irradiated with an ultraviolet ray, and thus, the protective film (a thickness of 100 nm) covering trench formation layer and the electroconductive pattern, was formed. The curable resin composition for forming the protective film, used here, contains a filler (silicon oxide) and a fluorine resin. A refractive index of the protective film was adjusted to be the values shown in Table 3 by changing the content of the filler.

<Evaluation of Transparency>

In the electroconductive substrates of Examples 13 to 15 and Example 1, the transparency of the electroconductive substrate was measured by the same method as the method described above. The results are shown in Table 3. As shown in Table 3, it was found that in a case where the refractive index of the protective film was greater than a refractive index of the air of 1.0, and was less than the refractive index of the trench formation layer, the transparency was particularly excellent.

TABLE 3

| | Electroconductive pattern layer (trench formation layer) | | | Protective film | | |
|---|---|---|---|---|---|---|
| | W/S (μm) | Thickness (μm) | Refractive index of trench formation layer | Content of filler (mass %) | Refractive index | Evaluation result Transparency |
| Example 1 | 1/200 | 2 | 1.51 | — | (1.0) | B |
| Example 13 | 1/200 | 2 | 1.51 | 82 | 1.33 | A |
| Example 14 | 1/200 | 2 | 1.51 | 25 | 1.50 | B |
| Example 15 | 1/200 | 2 | 1.51 | 6 | 1.55 | C |

According to the present invention, it is possible to produce the electroconductive substrate in which the electroconductive pattern layer filling the trench is provided, and the peeling of the electroconductive pattern layer and a decrease in the electroconductivity due to bending are suppressed. The method of the present invention is excellent, compared to a method including removing the electroconductive layer by etching, since the electroconductive pattern layer easily have a measurably large thickness, and thus, excellent electroconductivity is easily obtained.

Further, the present invention is also capable of providing the method of producing the electronic device or the display device in which the electroconductive pattern layer of the electroconductive substrate is prevented from being peeled off. In particular, in the display device, recently, a display device including a light emitting element such as a light emitting diode (LED) (for example, an LED display) has developed. In a liquid crystal display (LCD), backlight is controlled by transmissive liquid crystals, but in the LED display, a pixel is configured by using a light emitting diode which is a natural light emitting element. Accordingly, the LED display has characteristics such as a high brightness, long lifetime, and a high viewing angle.

In the display device including the light emitting element, it is preferable to decrease the size of the light emitting element itself, in order to improve the resolution. However, in a case where the size of the light emitting element decreases, it is necessary to form a fine electroconductive pattern layer, and thus, there is a tendency that the electroconductive pattern layer is easily peeled off, and the electroconductivity is difficult to be ensured. According to the present invention, it is possible to easily producing the display device in which even in a case where the size of the light emitting element decreases, the electroconductive pattern layer of the electroconductive substrate is hardly peeled off, and adhesiveness between the light emitting element and the electroconductive substrate is excellent.

1, 1A, 1B: electroconductive substrate, 2: base material, 3: foundation layer, 6: trench, 6a: bottom surface of trench, 6b, 6c: lateral surface of trench, 8: electroconductive pattern layer, 40: light emitting element, 44: connection portion, 45: adhesion layer, 46: insulating layer, 47: UBM layer, 50: display device.

What is claimed is:

1. A method of producing an electroconductive substrate including a base material, and an electroconductive pattern layer disposed on one main surface side of the base material, the method comprising:
    a step of forming a trench including a bottom surface to which a foundation layer is exposed, and a lateral surface which includes a surface of a trench formation layer according to an imprint method including pushing a mold including a convex portion into the trench formation layer formed on the foundation layer which is formed on the base material;
    a step of adsorbing a catalyst on the foundation layer which is exposed to the bottom surface of the trench; and
    a step of forming the electroconductive pattern layer which includes metal plating and fills the trench, by growing the metal plating from the foundation layer on which the catalyst is adsorbed.

2. The method according to claim 1,
    wherein the metal plating is grown such that a gap is formed between at least a part of a lateral surface of the electroconductive pattern layer and the lateral surface of the trench.

3. The method according to claim 1, further comprising:
    a step of blackening a surface of the electroconductive pattern layer, the surface including a surface on a side opposite to the bottom surface of the trench.

4. The method according to claim 1, further comprising:
    a step of forming a protective film covering at least a part of a surface of the trench formation layer and the electroconductive pattern layer on a side opposite to the base material.

5. The method according to claim 1,
    wherein the electroconductive pattern layer forms a mesh-like pattern.

6. A method of producing an electronic device including an electroconductive substrate which includes a base material, and an electroconductive pattern layer disposed on one main surface side of the base material, and an electronic component, the method comprising:
    a step of forming a trench including a bottom surface to which a foundation layer is exposed, and a lateral surface which includes a surface of a trench formation layer according to an imprint method including pushing a mold including a convex portion into the trench formation layer formed on the foundation layer which is formed on the base material;
    a step of adsorbing a catalyst on the foundation layer which is exposed to the bottom surface of the trench;
    a step of forming the electroconductive pattern layer which includes metal plating and fills the trench, by growing the metal plating from the foundation layer on which the catalyst is adsorbed; and
    a step of mounting the electronic component on the electroconductive substrate including the base material and the electroconductive pattern layer.

7. The method according to claim 6,
    wherein the step of mounting the electronic component on the electroconductive substrate, includes
    forming a connection portion on the electroconductive pattern layer, and
    connecting the electronic component to the electroconductive pattern layer through the connection portion.

8. The method according to claim 6,
    wherein the step of mounting the electronic component on the electroconductive substrate, includes
    forming an adhesion layer on the electroconductive pattern layer,
    forming an insulating layer which covers a surface of the trench formation layer on a side opposite to the foundation layer, and includes an opening portion to which a part of the adhesion layer is exposed,
    forming a UBM layer on a surface of the adhesion layer which is exposed into the opening portion of the adhesion layer,
    forming a connection portion on the UBM layer, and
    connecting the electronic component to the electroconductive pattern layer through the connection portion, the UBM layer, and the adhesion layer.

9. The method according to claim 6,
    wherein the metal plating is grown such that a gap is formed between at least a part of a lateral surface of the electroconductive pattern layer and the lateral surface of the trench.

10. A method of producing a display device including an electroconductive substrate which includes a base material, and an electroconductive pattern layer disposed on one main surface side of the base material, and a light emitting element, the method comprising:
    a step of forming a trench including a bottom surface to which a foundation layer is exposed, and a lateral surface which includes a surface of a trench formation layer according to an imprint method including pushing a mold including a convex portion into the trench formation layer formed on the foundation layer which is formed on the base material;
    a step of adsorbing a catalyst on the foundation layer which is exposed to the bottom surface of the trench;
    a step of forming the electroconductive pattern layer which includes metal plating and fills the trench, by growing the metal plating from the foundation layer on which the catalyst is adsorbed; and
    a step of mounting the light emitting element on the electroconductive substrate including the base material and the electroconductive pattern layer.

11. The method according to claim 10,
    wherein the step of mounting the light emitting element on the electroconductive substrate, includes
    forming a connection portion on the electroconductive pattern layer, and
    connecting the light emitting element to the electroconductive pattern layer through the connection portion.

12. The method according to claim 10,
    wherein the step of mounting the light emitting element on the electroconductive substrate, includes
    forming an adhesion layer on the electroconductive pattern layer,
    forming an insulating layer which covers a surface of the trench formation layer on a side opposite to the foundation layer, and includes an opening portion to which a part of the adhesion layer is exposed, forming a UBM layer on a surface of the adhesion layer which is exposed into the opening portion of the adhesion layer, forming a connection portion on the UBM layer, and connecting the light emitting element to the electroconductive pattern layer through the connection portion, the UBM layer, and the adhesion layer.

13. The method according to claim 10, wherein the metal plating is grown such that a gap is formed between at least a part of a lateral surface of the electroconductive pattern layer and the lateral surface of the trench.

\* \* \* \* \*